(12) United States Patent
Tohara et al.

(10) Patent No.: US 11,054,475 B2
(45) Date of Patent: Jul. 6, 2021

(54) ELECTRIC STORAGE CAPACITY ESTIMATION APPARATUS AND METHOD FOR OPERATING THE SAME

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Masahiro Tohara, Fuchu (JP); Masako Kiuchi, Fuchu (JP); Shunsuke Kawachi, Tama (JP); Mami Mizutani, Hachioji (JP); Takenori Kobayashi, Meguro (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 151 days.

(21) Appl. No.: 16/332,646

(22) PCT Filed: Sep. 14, 2016

(86) PCT No.: PCT/JP2016/077182
§ 371 (c)(1),
(2) Date: Mar. 12, 2019

(87) PCT Pub. No.: WO2018/051442
PCT Pub. Date: Mar. 22, 2018

(65) Prior Publication Data
US 2020/0292619 A1 Sep. 17, 2020

(51) Int. Cl.
*G01R 31/367* (2019.01)
*G01R 31/396* (2019.01)
(Continued)

(52) U.S. Cl.
CPC ....... *G01R 31/367* (2019.01); *G01R 31/3828* (2019.01); *G01R 31/396* (2019.01);
(Continued)

(58) Field of Classification Search
CPC G01R 31/367; G01R 31/396; G01R 31/3828; G01R 31/3842; G01R 31/36;
(Continued)

(56) References Cited

U.S. PATENT DOCUMENTS

2005/0073315 A1 4/2005 Murakami et al.
2011/0130985 A1* 6/2011 Plett ..................... G01R 31/392
702/63

(Continued)

FOREIGN PATENT DOCUMENTS

JP 11-38105 A 2/1999
JP 2007-322353 A 12/2007
(Continued)

OTHER PUBLICATIONS

Plett, Recursive approximate weighted total least squares estimation of battery cell total capacity, vol. 196, Issue 4, Feb. 15, 2011, pp. 2319-2331 (Year: 2011).*

(Continued)

*Primary Examiner* — Daniel R Miller
(74) *Attorney, Agent, or Firm* — Oblon, McClelland, Maier & Neustadt, L.L.P.

(57) ABSTRACT

A battery capacity estimation apparatus includes one or more hardware processors that: calculate a current integrated value by integrating electric currents of a secondary battery system whose capacity is to be estimated; calculate an SOC estimate value in a stabilization state where a change in SOC of a secondary battery per unit time is comparatively small; perform a regression analysis in which the current integrated value is defined as a dependent variable and the SOC
(Continued)

estimate value is defined as an independent variable, the regression analysis being performed while correcting the current integrated value based on a value of a coefficient of determination so that a result of the regression analysis has predetermined accuracy; and estimate a capacity of the secondary battery system based on the result of the regression analysis.

10 Claims, 16 Drawing Sheets

(51) Int. Cl.
  *G01R 31/3828* (2019.01)
  *H01M 10/48* (2006.01)
  *H02J 7/00* (2006.01)
  *H01M 10/42* (2006.01)

(52) U.S. Cl.
  CPC ....... *H01M 10/425* (2013.01); *H01M 10/482* (2013.01); *H02J 7/0014* (2013.01); *H02J 7/0048* (2020.01); *H01M 2010/4271* (2013.01)

(58) Field of Classification Search
  CPC .. G01R 31/392; G01R 31/382; G01R 31/389; G01R 31/3835; G01R 31/3648; G01R 31/374; G01R 31/371; G01R 31/387; G01R 31/385; G01R 31/388; G01R 31/378; G01R 31/3833; G01R 19/16542; G01R 1/203; G01R 31/3647; G01R 35/005; H02J 7/0048; H02J 7/0014; H02J 7/00; H02J 7/0047; H02J 7/0021; H02J 7/005; H02J 7/00716; Y02E 60/10; H01M 10/48; H01M 10/425; H01M 10/482; H01M 2010/4271; H01M 10/0525; H01M 2220/20; H01M 10/486; H01M 10/4257; H01M 10/44; H01M 2010/4278; H01M 10/441; H01M 2220/30; H01M 8/188; H01M 10/052; H01M 10/4285; H01M 2/1077; H01M 8/20; H01M 10/443; H01M 10/4207; H01M 4/131; H01M 10/054; H01M 10/0562; H01M 10/488; H01M 16/00; H01M 4/136; H01M 10/42; H01M 2/1055; H01M 4/405; Y02T 10/70; B60L 58/12; B60L 58/13
  See application file for complete search history.

(56) References Cited

U.S. PATENT DOCUMENTS

| | | | | |
|---|---|---|---|---|
| 2012/0101753 | A1* | 4/2012 | Lin | H01M 10/48 702/63 |
| 2013/0293006 | A1* | 11/2013 | Kang | H02J 1/10 307/10.1 |
| 2015/0081237 | A1* | 3/2015 | Ye | B60L 3/12 702/63 |
| 2015/0260800 | A1* | 9/2015 | Baba | G01R 31/392 702/63 |

FOREIGN PATENT DOCUMENTS

| | | |
|---|---|---|
| JP | 2007-322398 A | 12/2007 |
| JP | 2012-247374 A | 12/2012 |
| JP | 5329894 B2 | 10/2013 |

OTHER PUBLICATIONS

Markovsky et al., Overview of total least-squares methods, Signal Processing 87 (2007) 2283-2302 (Year: 2007).*

Lin, C., et al., "A Novel Approach to State of Charge Estimation using Extended Kalman Filtering for Lithium-Ion Batteries in Electric Vehicles", 2014 IEEE Conference and EXPO Transportation Electrification, IEEE, Aug. 31, 2014, XP032671629, pp. 1-6.

Verbrugge. M.. et al., "Adaptive state of charge algorithm for nickel metal hydride batteries including hysteresis phenomena", Journal of Power Sources. vol. 126, No. 1-2, XP004487901, Feb. 16, 2004, pp. 236-249.

International Search Report dated Dec. 6, 2016 in PCT/JP2016/077182 filed Sep. 14, 2016.

"Secondary lithium cells and batteries for use in industrial applications—Part 1 : Tests and requirements of performance," Japanese Industrial Standards, 2012, (with unedited computer-generated English translation).

* cited by examiner

FIG.9

| VALID F | SOC | Σ I | Σ t |
|---|---|---|---|
| 1 | 32.44 | 7678 | 155918 |
| 1 | 35.52 | 3266 | 117192 |
| 1 | 46.18 | -4567 | 85230 |
| 1 | 42.20 | -3411 | 58768 |
| 1 | 29.73 | 3985 | 51577 |
| 1 | 27.13 | 5737 | 43245 |
| 1 | 35.60 | 11610 | 284293 |
| 1 | 43.00 | 4877 | 248413 |
| 1 | 41.28 | 4270 | 212500 |
| 1 | 34.87 | 7822 | 206401 |
| 1 | 34.02 | 8021 | 192894 |
| 1 | 32.33 | 1160 | 15149 |

FIG.10

| I_offset= | 0.00 | -0.02 | -0.03 | -0.04 | -0.05 | -0.06 | -0.0460 |
|---|---|---|---|---|---|---|---|
| | NO CORREC-TION | CORREC-TION 1 | CORREC-TION 2 | CORREC-TION 3 | CORREC-TION 4 | CORREC-TION 5 | CORREC-TION 6 |
| | 7678 | 4559 | 3000 | 1441 | -118 | -1678 | 505 |
| | 3266 | 922 | -250 | -1422 | -2594 | -3766 | -2125 |
| | -4567 | -6271 | -7124 | -7976 | -8828 | -9680 | -8487 |
| | -3411 | -4586 | -5174 | -5762 | -6349 | -6937 | -6114 |
| | 3985 | 2953 | 2438 | 1922 | 1406 | 890 | 1612 |
| | 5737 | 4872 | 4440 | 4007 | 3575 | 3142 | 3748 |
| | 11610 | 5924 | 3081 | 238 | -2605 | -5448 | -1468 |
| | 4877 | -91 | -2575 | -5059 | -7544 | -10028 | -6550 |
| | 4270 | 20 | -2105 | -4230 | -6355 | -8480 | -5505 |
| | 7822 | 3694 | 1630 | -434 | -2498 | -4562 | -1672 |
| | 8021 | 4163 | 2234 | 305 | -1624 | -3552 | -852 |
| | 1160 | 857 | 706 | 554 | 403 | 251 | 463 |

FIG.11

| ID | VALIDITY/ INVALIDITY FLAG | SOC(%) OF EACH STABILIZATION STATE | FROM EACH OBTAINING TIME TO CURRENT TIME | | OFFSET-APPLIED $\Sigma I(A \cdot s)$ | CAPACITY ESTIMATE VALUE C_est(Ah) | COEFFICIENT OF DETERMINATION $R^2$ |
|---|---|---|---|---|---|---|---|
| | | | $\Sigma I(A \cdot s)$ | ELAPSED TIME(s) | | | |
| 0 | 0 | - | - | - | - | - | - |
| 1 | 0 | - | - | - | - | - | - |
| 2 | 1 | 53.1 | 13420 | 4055 | 12135 | 17.92 | 0.85 |
| 3 | 1 | 56.4 | 9345 | 2856 | 7991 | 18.03 | 0.98 |
| 4 | 1 | 47.3 | 0 | 0 | 0 | - | - |
| 5 | 0 | | | | | | |
| 6 | 0 | | | | | | |
| ... | ... | ... | | | | ... | |
| 98 | 0 | | | | | | |
| 99 | 0 | | | | | | |

101

(I_offset=0.00)

(I_offset=-0.03)

(ONLY INTERVAL TM1)

(ONLY INTERVAL TM2)

(INTERVAL TM1 AND INTERVAL TM2)

(ENTIRE INTERVAL)

US 11,054,475 B2

ELECTRIC STORAGE CAPACITY ESTIMATION APPARATUS AND METHOD FOR OPERATING THE SAME

CROSS-REFERENCE TO RELATED APPLICATIONS

This application is national stage application of International Application No. PCT/JP2016/077182, filed Sep. 14, 2016, which designates the United States, incorporated herein by reference.

FIELD

Embodiments described herein relate generally to an electric storage capacity estimation apparatus and a method for operating the same.

BACKGROUND

In recent years, the introduction of safe-and-clean natural energy, such as photovoltaic power generation, wind power generation, or the like, has been accelerated. However, the power of the natural energy is unstable, and there is concern that the acceleration of extensive introduction of the natural energy causes adverse effects on the voltage and the frequency in an electric power system. Furthermore, when the amount of supply of the natural energy extensively exceeds electric power demands, it is necessary to stop the natural energy power generation system thus lowering the utilization factor of power generation equipment.

In order to solve those drawbacks, it is expected that a large-scale storage battery system that uses a secondary battery is provided to the power generation system so as to suppress the output fluctuation of the natural energy by the charge-and-discharge electric power to/from the storage battery, or store surplus electric power in the storage battery.

Means for Solving Problem

In an electric storage capacity estimation apparatus according to an embodiment, a current integrated value calculation unit calculates a current integrated value by integrating electric currents of a secondary battery system whose capacity is to be estimated, the electric currents being detected by a current sensor. An SOC estimate-value calculation unit calculates an SOC estimate value in a stabilization state where a change in SOC of a secondary battery per unit time is comparatively small, the secondary battery constituting the secondary battery system. A regression analysis unit performs a regression analysis in which the current integrated value is defined as a dependent variable and the SOC estimate value is defined as an independent variable, the regression analysis being performed while correcting the current integrated value based on a value of a coefficient of determination so that a result of the regression analysis has predetermined accuracy. An estimation unit estimates a capacity of the secondary battery system based on the result of the regression analysis.

BRIEF DESCRIPTION OF DRAWINGS

FIG. 9 is an explanatory diagram of stabilization data stored.

FIG. 10 is an explanatory diagram for explaining the correction of the current integrated value of the stabilization data.

FIG. 11 is an explanatory diagram of a stabilization data table.

DETAILED DESCRIPTION

According to one embodiment, a battery capacity estimation apparatus includes one or more hardware processors that: calculate a current integrated value by integrating electric currents of a secondary battery system whose capacity is to be estimated; calculate an SOC estimate value in a stabilization state where a change in SOC of a secondary battery per unit time is comparatively small; perform a regression analysis in which the current integrated value is defined as a dependent variable and the SOC estimate value is defined as an independent variable, the regression analysis being performed while correcting the current integrated value based on a value of a coefficient of determination so that a result of the regression analysis has predetermined accuracy; and estimate a capacity of the secondary battery system based on the result of the regression analysis.

Next, embodiments are explained with reference to drawings.

Figure 1:
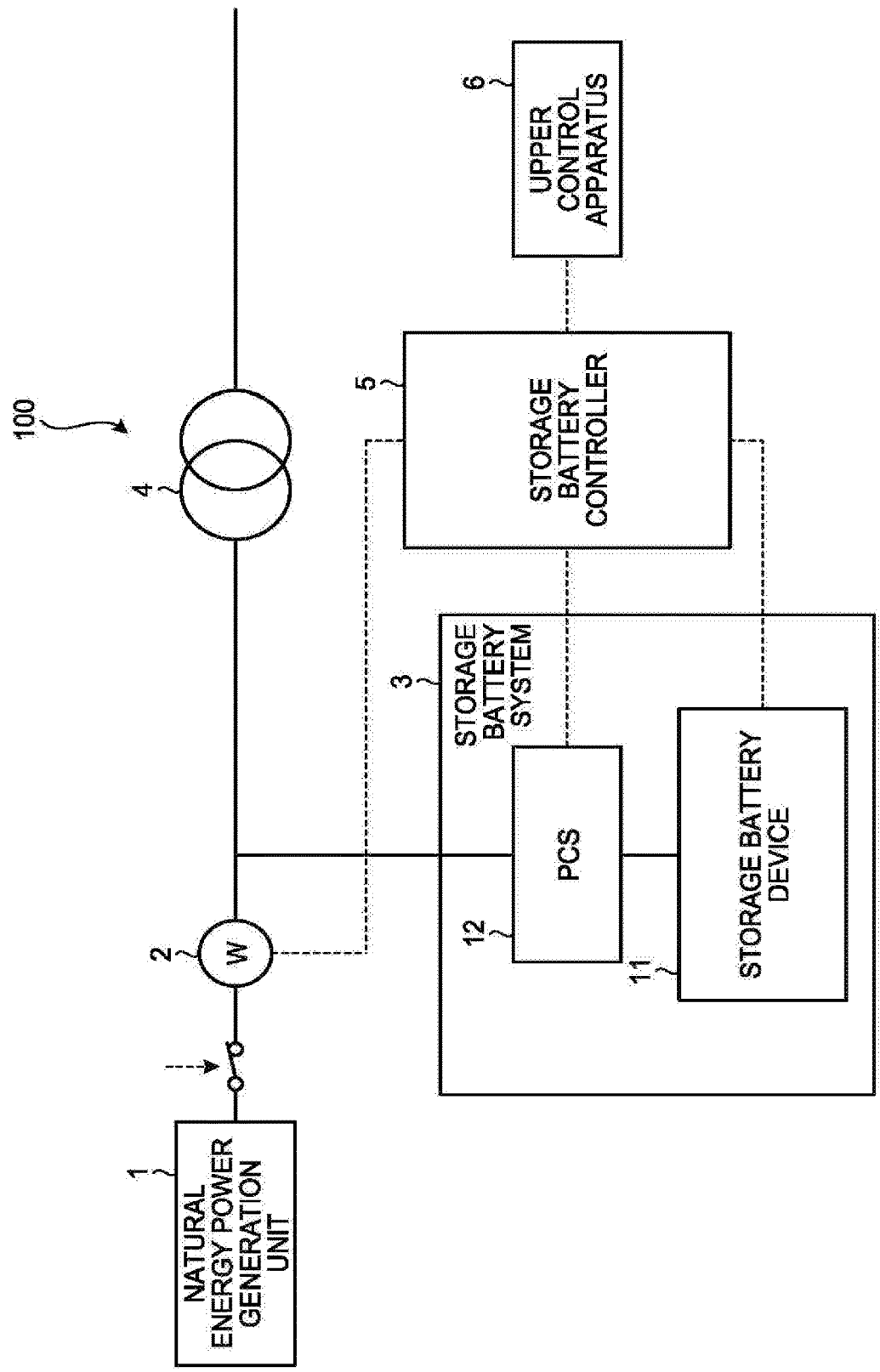
FIG. 1 is a schematic block diagram of a natural energy power generation system provided with a storage battery system.

FIG. 1 is a schematic block diagram of a natural energy power generation system provided with a plurality of storage battery systems.

A natural energy power generation system 100 is provided with: a natural energy power generation unit 1 that functions as an electric power system and is capable of outputting power as system power by using natural energies (renewable energies), such as sunlight, hydraulic power, wind power, biomass, or geothermal power; a wattmeter 2 that measures the generated output of the natural energy power generation unit 1; a storage battery systems 3 that charges the surplus power of the natural energy power generation unit 1 based on the measurement result of the wattmeter 2 and discharges power equivalent to insufficient power so as to add the discharged power to the output power of the natural energy power generation unit 1; a transformer 4 that performs voltage conversion of output power of the natural energy power generation unit 1 (the output power to be converted may include the discharged power output from the storage battery systems 3); a storage battery controller 5 that locally controls the storage battery systems 3; and an upper control apparatus 6 that performs remote control of the storage battery controller 5.

Figure 2:
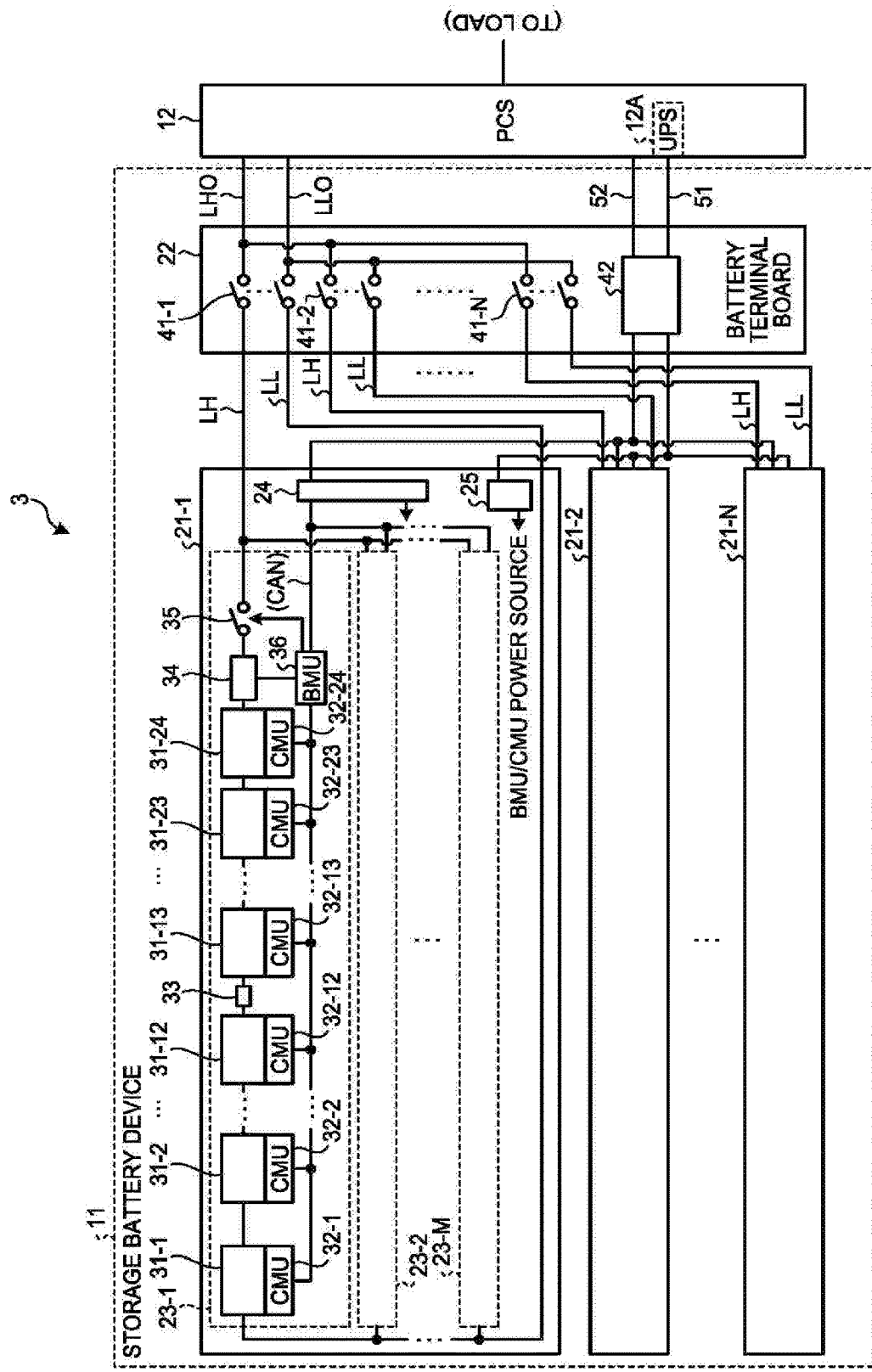
FIG. 2 is a schematic configuration block diagram of the storage battery systems according to embodiments.

FIG. 2 is a schematic configuration block diagram of the storage battery system according to the embodiments.

The storage battery systems 3 is roughly provided with a storage battery device 11 that stores electric power therein, and a power conditioning system (PCS) 12 that converts DC power supplied from the storage battery device 11 into AC power having intended electric power quality, and supplies the AC power to a work load.

The storage battery device 11 is roughly provided with a plurality of battery boards 21-1 to 21-N (N is a natural number), and a battery terminal board 22 to which the battery boards 21-1 to 21-N are connected.

Each of the battery boards 21-1 to 21-N is provided with a plurality of battery units 23-1 to 23-M (M is a natural number) that are connected to each other in parallel, a gateway unit 24, and a DC power supply unit 25 that supplies DC power for operation to a battery management Unit (BMU) and a cell monitoring unit (CMU) that are described later.

Here, the constitution of the battery unit is explained.

Each of the battery unit 23-1 to 23-M is connected to output power lines (output power wires: bus lines) LHO, and LLO via a high potential side power source supply line (high potential side power source supply wire) LH and a low potential side power source supply line (low potential side power source supply wire) LL, respectively, to supply electric power to a power conditioning system 12 that constitutes a main circuit.

Since the battery units 23-1 to 23-M have individual constitutions identical with each other, the explanation is made by taking the battery unit 23-1 as an example.

The battery unit 23-1 is roughly provided with a plurality of cell modules 31-1 to 31-24 (24 modules in FIG. 2), a plurality of CMUs 32-1 to 32-24 (24 units in FIG. 2) that are arranged in the cell modules 31-1 to 31-24, respectively, a service disconnector 33 arranged between the cell module 31-12 and the cell module 31-13, a current sensor 34, and a contactor 35, wherein the cell modules 31-1 to 31-24, the service disconnector 33, the current sensor 34, and the contactor 35 are serially connected to each other.

Here, the cell modules 31-1 to 31-24 constitute a battery pack in which a plurality of battery cells are connected in serial/parallel. The cell modules 31-1 to 31-24, which are connected in serial, constitute a battery-pack group.

The battery unit 23-1 is provided with a BMU 36, and the communication line of each of the CMUs 32-1 to 32-24 and the output line of the current sensor 34 are connected to the BMU 36.

The BMU 36 controls the battery unit 23-1 as a whole under the control of the gateway unit 24, and performs opening/closing control of the contactor 35 based on the result of communication with each of the CMUs 32-1 to 32-24 (voltage data and temperature data that are described later), and the detection result of the current sensor 34.

Next, the constitution of the battery terminal board is explained.

The battery terminal board 22 is provided with a plurality of board circuit breakers 41-1 to 41-N that correspond to the respective battery boards 21-1 to 21-N, and a master device 42 constituted as a microcomputer that controls the storage battery device 11 as a whole.

The master unit 42 and the power conditioning systems 12 connect therebetween a control source wire 51 through which power is supplied via an uninterruptible power system (UPS) 12A of the power conditioning system 12, and a control communication wire 52 that is constituted as Ethernet (registered trademark) and used for exchanging control data.

Here, the explanation is made with respect to the detailed configuration of the cell-modules 31-1 to 31-24, the CMUs 32-1 to 32-24, and the EMU 36.

Figure 3:
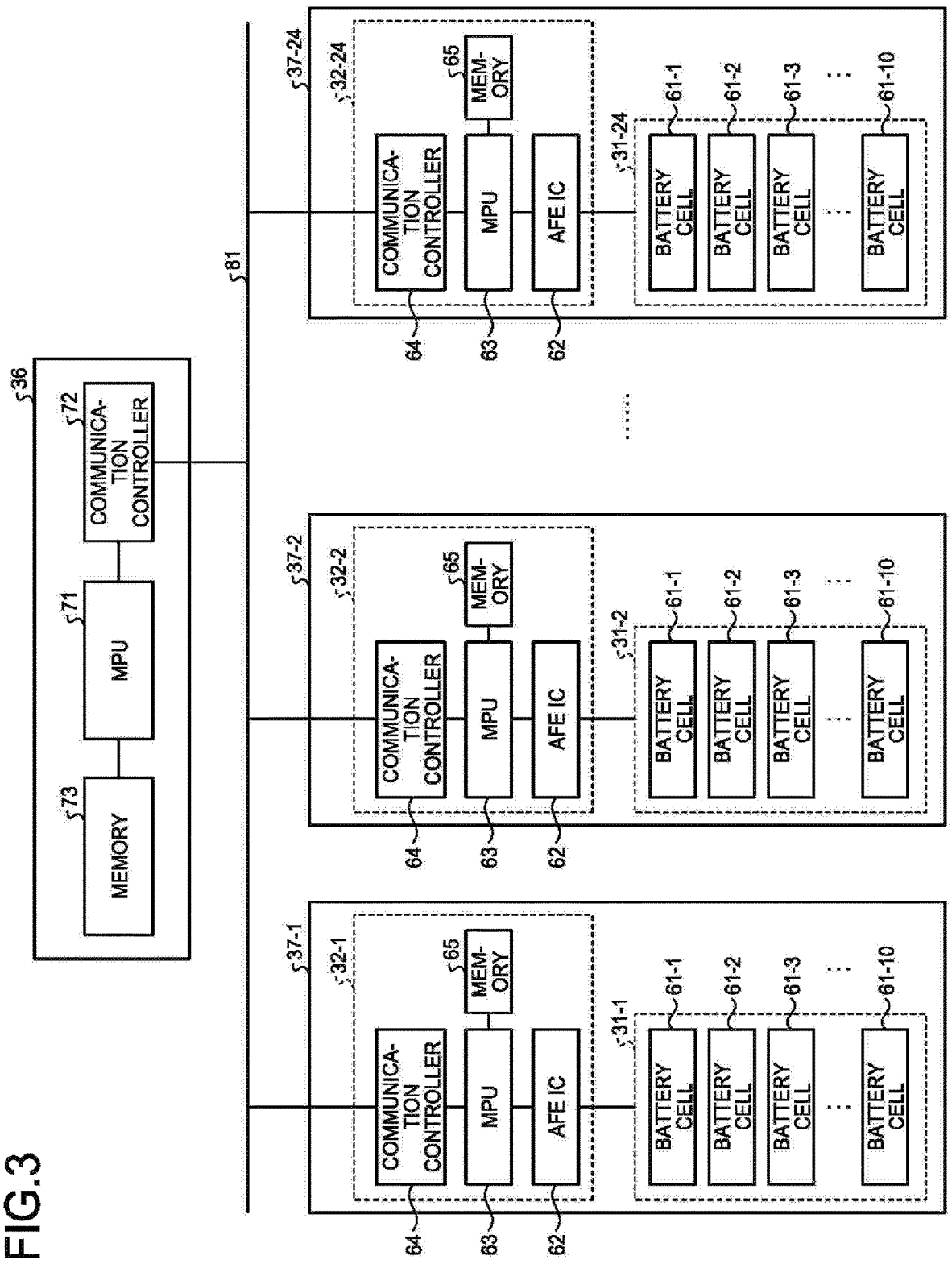
FIG. 3 is a detailed configuration explanatory diagram of cell modules, CMUs, and a BMU.

FIG. 3 is a detailed constitution explanatory diagram of the cell modules, the CMUs, and the BMU. Each of the cell modules 31-1 to 31-24 is provided with a plurality of battery cells 61-1 to 61-10 (ten cells in FIG. 3) that are serially connected to each other.

Each of the CPUs 32-1 to 32-24 is provided with an analog front end IC (AFF-IC) 62 for measuring the voltages of the battery cells 61-1 to 61-10 that constitute each of the cell modules 31-1 to 31-24 and the temperatures at prescribed points in the battery cells 61-1 to 61-10, an MPU 63 that controls the corresponding CMU (one of the CPUs 32-1 to 32-24) as a whole, a communication controller 64 compatible with the Controller Area Network (CAN) specification for performing the CAN communication with the EMU 36, and a memory 65 that stores voltage data corresponding to the voltage for each cell and temperature data.

In the following explanation, the constitutions in which the cell modules 31-1 to 31-24 are made to correspond to the CMUs 32-1 to 32-24, respectively, are referred to as battery modules 37-1 to 37-24. For example, the constitution of the cell module 31-1 and the CMU 32-1 that correspond to each other is referred to as the battery module 37-1.

Furthermore, the BMU 36 is provided with an MPU 71 configured to control the BMU 36 as a whole, a communication controller 72 compatible with the CAN specification for performing CAN communication with the CMUs 32-1 to 32-24, and a memory 73 configured to store voltage data and temperature data that are transmitted from the CMUs 32-1 to 32-24.

The storage battery controller 5 detects the generated output of the natural energy power generation unit 1, and mitigates the effect of the generated output on the electric power system by suppressing the output fluctuation of the generated output using the storage battery device 11. Here, a fluctuation suppression amount with respect to the storage battery device 11 is calculated in the storage battery controller 5 or the upper control apparatus 6, and fed to the power conditioning system (PCS) 12 corresponding to the storage battery device 11 as a charge-and-discharge command.

Hereinafter, the principle of the embodiment is explained.

In the present embodiment, the storage battery system 3 for fluctuation suppression of the electric power system estimates both the capacity (full charge capacity) of the storage battery system 3 and the offset error of the current sensor by using an SOC estimate value and an electric current value based on a closed circuit voltage (CCV).

To be more specific, the storage battery system 3 estimates the capacity (full charge capacity) of the storage battery system 3 and the offset error of the current sensor. The estimation is performed by carrying out the regression analysis with respect to the SOC estimate value in a state that an SOC change per unit time is comparatively moderate, that is, in a state that a charge-discharge current value is small (hereinafter, referred to as a stabilization state), and with respect to a current integrated value from the time of detecting that the SOC is brought into the stabilization state to the time of estimating the SOC.

Here, prior to the detailed explanation of the embodiment, the principle of the embodiment is explained.

Figure 4:
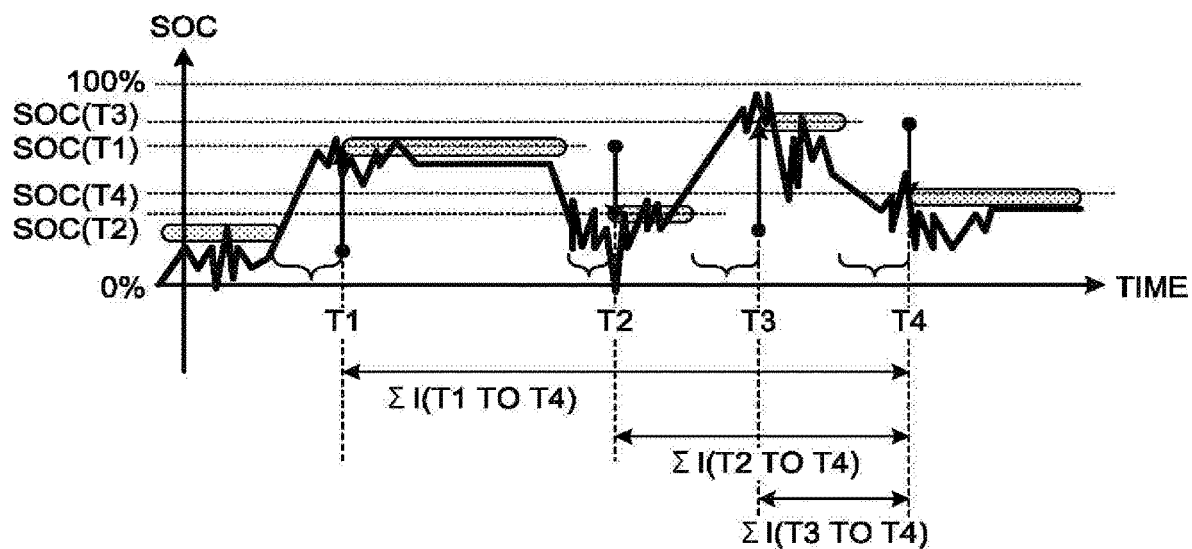
FIG. 4 is an explanatory diagram of one example of change of SOC over time.

FIG. 4 is an explanatory diagram of one example of change of SOC over time.

As illustrated in FIG. 4, in the period of the stabilization state, the temporal change in SOC is brought into a comparatively moderate state even though the comparatively small fluctuation of the amplitude is observed, and the SOC fluctuates comparatively greatly in a non-stabilized state.

Here, the period of the stabilization state is a period where it is possible to expect that the accuracy of the SOC estimate value based on cell voltage information is comparatively high.

The SOC estimate value obtained from the DMU 36 that functions as an SOC estimation means at a timing (time T1, T2, T3, or T4) when it is detected that the SOC is switched from the non-stabilized state to the stabilization state is indicated as SOC (T1), SOC (T2), SOC (T3), or SOC (T4). The current integrated value between the time T1 and the time T4 is indicated as $\Sigma I_{(T1\text{-}T4)}$, the current integrated value between the time T2 and the time T4 is indicated as $\Sigma I_{(T2\text{-}T4)}$, and the current integrated value between the time T3 and the time T4 is indicated as $\Sigma I_{(T3\text{-}T4)}$.

Figure 5:
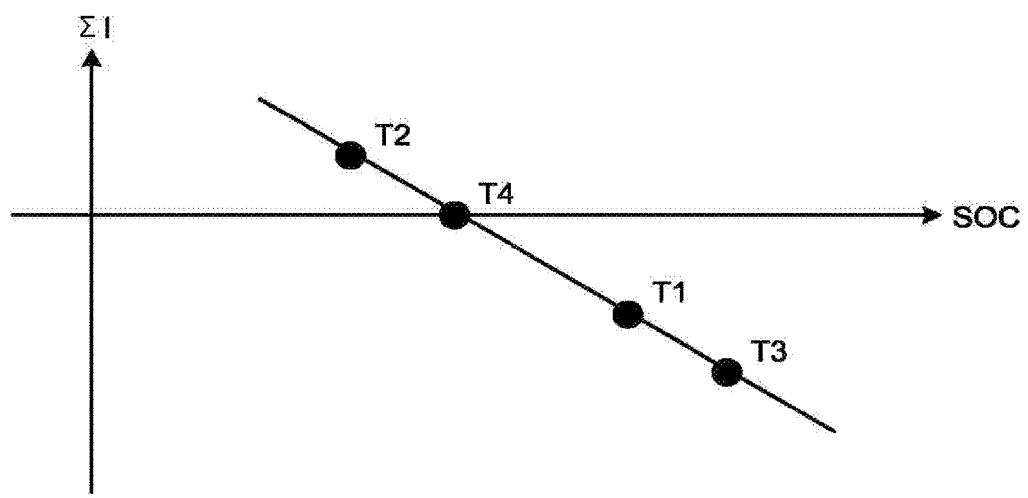
FIG. 5 is an explanatory diagram of the relation between an SOC estimate value and a current integrated value.

FIG. 5 is an explanatory diagram of the relation between the SOC estimate value and the current integrated value.

Here, the relation between the SOC estimate value and the current integrated value is obtained by the regression analysis, wherein the SOC estimate value is an independent variable, and the current integrated value is a dependent variable.

Here, it is assumed that there is no error in the SOC estimate values SOC (T1) to SOC (T4) at times T1, T2, T3, and T4, respectively, and the current integrated values $\Sigma I_{(T1\ to\ T4)}$, $\Sigma I_{(T2\ to\ T4)}$, and $\Sigma I_{(T3\ to\ T4)}$. In this assumption, when the estimate value of SOC is taken on an axis of abscissa, and the current integrated value $\Sigma I$ is taken on an axis of ordinate, plots of the SOC estimate values SOC (Tn) and current integrated values $\Sigma I_{(Tn\text{-}T4)}$ at the time points T1, T2, T3, and T4 (time Tn, n=1 to 4) represent, as illustrated in FIG. 5, a downward-sloping linear relation with an axis-of-abscissa intercept of T4.

This is because the following equation (1) is established between the SOC estimate value SOC (Tn) and the current integrated value $\Sigma I$ when the value of the SOC estimate value SOC is set to 0 to 1, the current integrated value $\Sigma I$ is denoted in terms of Ah, and the capacity of the battery is indicated by C(in units of Ah).

Equation 1

$$SOC(T4) = SOC(Tn) + \frac{\sum_{t=Tn}^{T4} I}{c} \quad (1)$$

Therefore, the following equation (2) and equation (3) are established.

Equation 2

$$\sum_{t=Tn}^{T4} I = C \times [SOC(T4) - SOC(Tn)] \quad (2)$$

Equation 3

$$C = \frac{\sum_{t=Tn}^{T4} I}{SOC(T4) - SOC(Tn)} \quad (3)$$

It is evident that the capacity of the battery C of the storage battery systems 3 is obtained from the equation (3) and the inclination of the regression line illustrated in FIG. 5.

1. First Embodiment

Next, operation according to the first embodiment will be explained.

Figure 6:
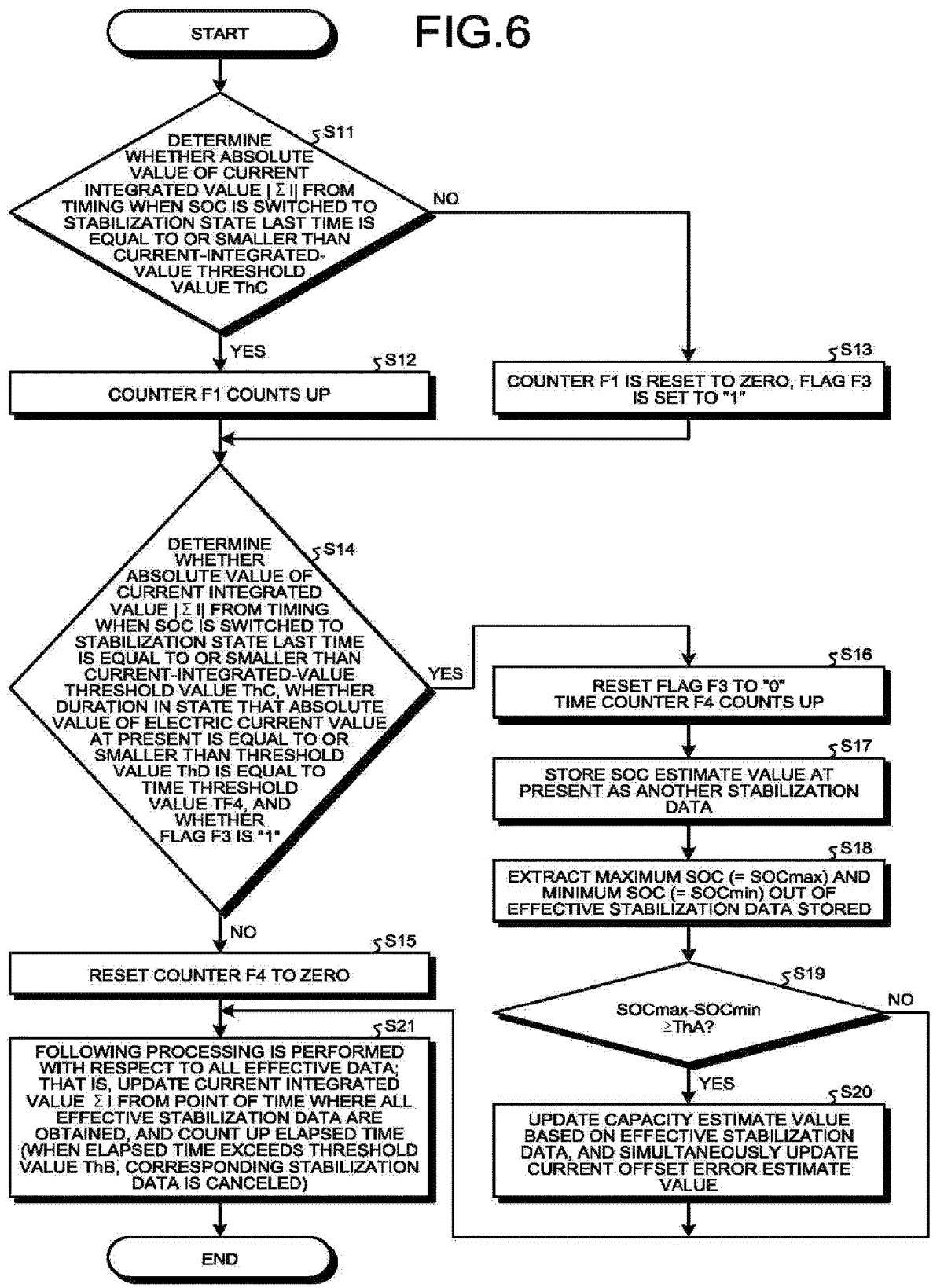
FIG. 6 is an operation flow chart according to a first embodiment.

FIG. 6 is an operation flow chart according to the first embodiment.

Figure 7:
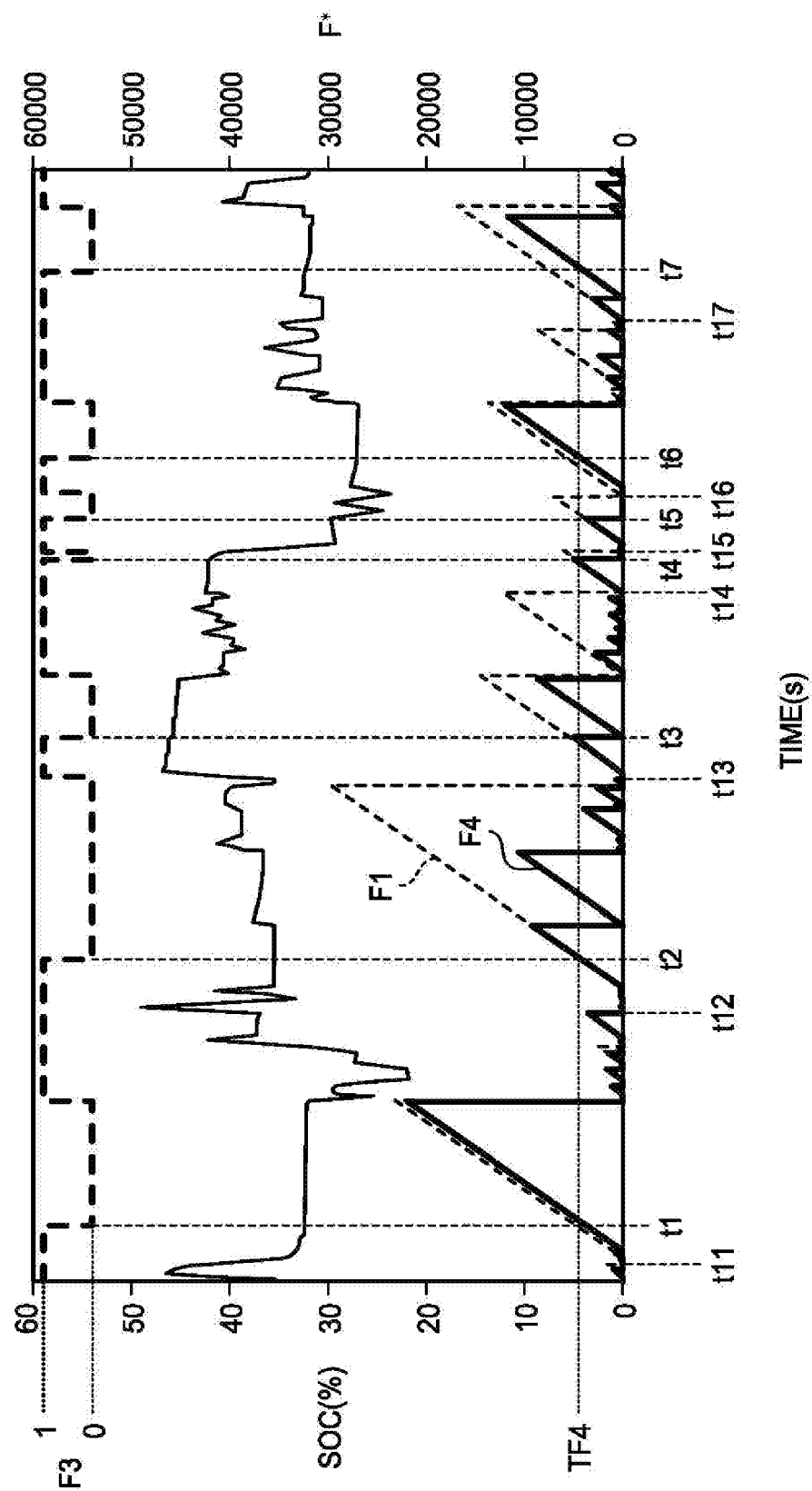
FIG. 7 is an operation timing chart of the storage battery system according to the first embodiment.

FIG. 7 is an operation timing chart of the storage battery system according to the first embodiment.

The processing illustrated in FIG. 6 is, for example, processing installed in the EMU 36, the processing being performed as fixed-cycle processing (for every one second, for example). The following explanation is made assuming that the GMU 36 performs the processing.

In this case, at a time of power activation, initialization processing that resets a stabilization data matrix, each of flags, and each of the contents of counters to zero is performed.

The BMU 36 determines whether predetermined fluctuation occurs in the SOC of the storage battery systems 3 (Step S11 to Step S13).

To be more specific, the BMU 36 first determines whether the absolute value of the current integrated value $\Sigma I$ from the timing when the last time T1 is detected is equal to or smaller than a current-integrated-value threshold value ThC (Step S11).

In determining at Step S11, when the absolute value of the current integrated value $\Sigma I$ from the timing when the last time T1 is detected exceeds the current-integrated-value threshold value ThC (No at Step S11), the SOC is switched to the non-stabilized state and hence, a counter F1 for counting the stabilization time from the timing when the last time T1 is detected is reset to zero, and a flag F3 indicating that the SOC is a fluctuation state, that is, the SOC is a non-stabilized state, is set to "1" (Step S13), and the processing advances to Step S14.

In determining at Step S11, when the absolute value of the current integrated value ΣI from a timing when the last time T1 is detected is equal to or smaller than the current-integrated-value threshold value ThC (Yes at Step S11), the counter F1 for counting the stabilization time from the timing when the last time T1 is detected counts up (Step S12).

Next, in addition that the absolute value of the current integrated value ΣI from the past timing T1 is equal to or smaller than the current-integrated-value threshold value ThC, the BMU 36 determines whether a duration where the absolute value of the electric current value at present is equal to or smaller than a threshold current value ThD is equal to a time threshold value TF4, and whether the flag F3 is "1", that is, the stabilization state continues by the time equivalent to the time threshold value TF4 after the fluctuation in SOC (Step S14).

In determining at Step S14, when the stabilization state does not still continue by the time equivalent to the time threshold value TF4 after the fluctuation in SOC (No at Step S14), the BMU 36 resets a counter F4 to zero (Step S15), updates the current integrated value ΣI from a point of time when all effective stabilization data are obtained, and counts up an elapsed time (Step S21). Here, when the elapsed time exceeds a threshold value ThB, corresponding stabilization data is canceled.

On the other hand, in determining at Step S14, when the stabilization state continues by the time corresponding to the time threshold TF4 after the fluctuation in SOC (Yes at Step S14), the BMU 36 resets the flag F3 to "0" (Step S16), and stores an SOC estimate value corresponding to the stabilization state as another stabilization data (effective stabilization data) (Step S17).

To be more specific, when the counter F1 is reset to zero at each of the times t11, t12, t13, t14, t15, t16, and t17 illustrated in FIG. 7 and thereafter, the time counter F4 first continuously counts up in a time corresponding to the time threshold value TF4 (at the timing corresponding to each of the times t1, t2, t3, t4, t5, t6, and t7 illustrated in FIG. 7), the Flag F3 is reset to "0", and the SOC estimate value SOC in the period of a stabilization state corresponding to the count-up period of the counter F4 is stored as another stabilization data in a stabilization data table 101 (see FIG. 11). The stabilization data table 101 will be specifically explained later.

Next, the BMU 36 extracts a maximum SOC (=SOCmax) and a minimum SOC (=SOCmin) out of the effective stabilization data stored (Step S18).

Subsequently, the BMU 36 determines whether the difference between the maximum SOC and the minimum SOC (=SOCmax−SOCmin) is equal to or greater than a threshold value ThA, that is, the BMU 36 determines whether the following relation is established (Step S19).

$$SOCmax - SOCmin \geq ThA$$

In determining at Step S19, when the difference between the maximum SOC and the minimum SOC (=SOCmax−SOCmin) is smaller than the threshold value ThA, that is, when the following relation is established (No at Step S19), the BMU 36 advances the processing to Step S21.

$$SOCmax - SOCmin < ThA$$

In determining at Step S19, when the difference between the maximum SOC and the minimum SOC (=SOCmax−SOCmin) is equal to or greater than the threshold value ThA (Yes at Step S19), the BMU 36 updates the capacity estimate value based on the effective stabilization data, and simultaneously updates the offset error estimate value of the current sensor (Step S20).

Subsequently, the BMU 36 updates the current integrated value ΣI from a point of time when all effective stabilization data are obtained, and counts up an elapsed time (Step S21). Here, when the elapsed time exceeds the threshold value ThB, corresponding stabilization data is canceled.

Here, the explanation is made with respect to update processing of the capacity estimate value and the offset error estimate value of the current sensor, the update process being performed based on the effective stabilization data.

The capacity estimate value is set to a latest value of a capacity estimate value C_est, and the offset error estimate value of the current sensor is set to a latest value of a current offset error estimate value I_offset. A coefficient of determination $R^2$ (=square of coefficient of multiple correlation R) of the regression line is calculated by slightly increasing or decreasing the value C_est and the value I_offset individually, and the capacity estimate value and the current offset error estimate value are updated by using a steepest ascent method.

Figure 8:
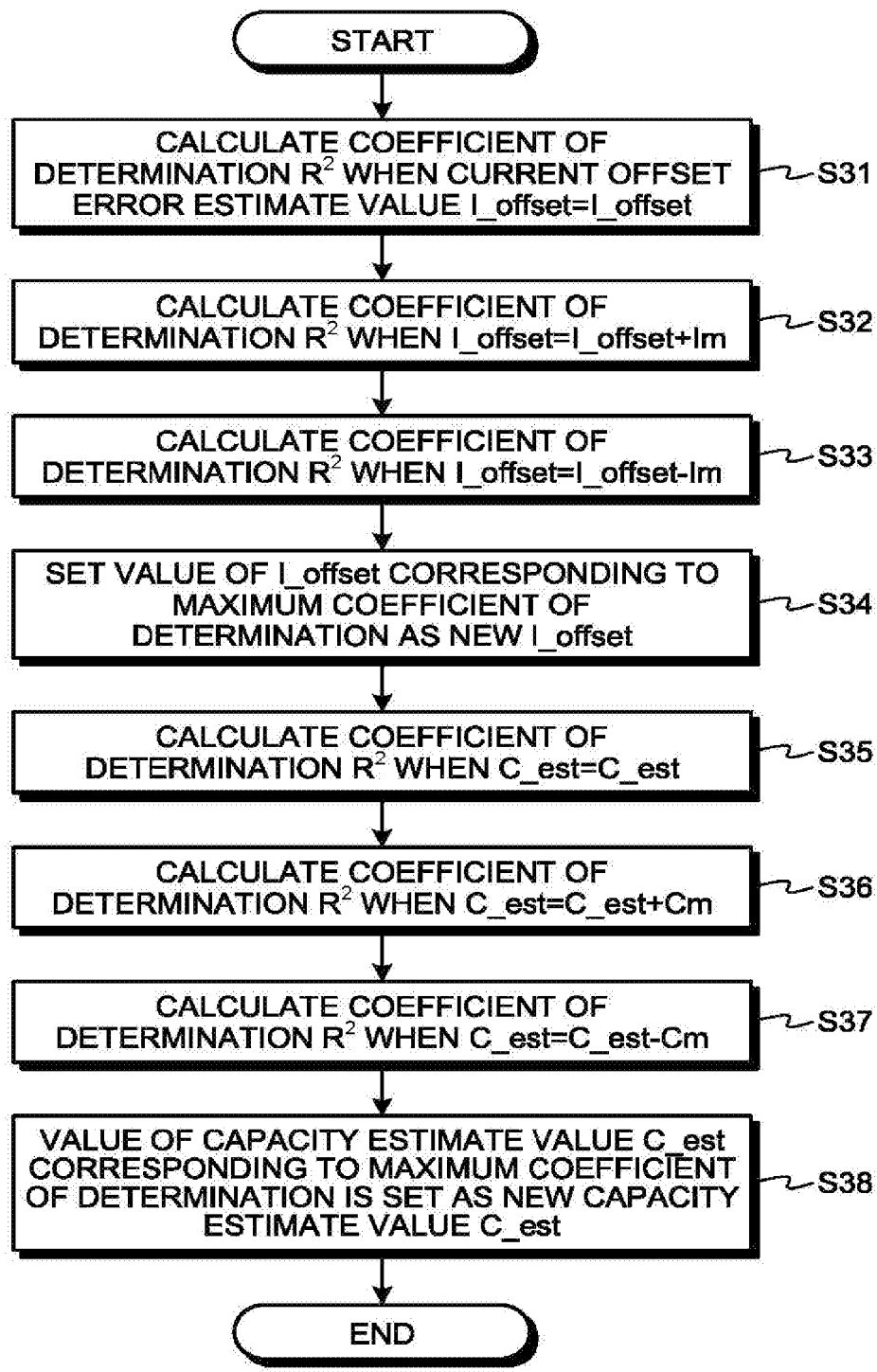
FIG. 8 is a processing flowchart of update processing of a capacity estimate value and a current offset error estimate value.

FIG. 8 is a processing flowchart of update processing of the capacity estimate value and the current offset error estimate value.

To be more specific, the BMU 36 first calculates the coefficient of determination $R^2$ (=RR1) when current offset error estimate value I_offset=I_offset (Step S31).

Next, the BMU 36 sets a correction value (correction amount) of the current offset error estimate value I_offset to Im, and calculates the coefficient of determination $R^2$ (=RR2) when I_offset=I_offset+Im (Step S32).

Furthermore, the BMU 36 calculates the coefficient of determination $R^2$ (=RR3) when I_offset=I_offset−Im (Step S33).

A value of I_offset corresponding to the maximum coefficient of determination (I_offset, I_offset+Im, or I_offset−Im) out of the coefficients of determination RR1 to RR3 that are calculated is set as a new I_offset (Step S34), and the BMU 36 calculates the coefficient of determination $R^2$ (=RR11) using the new I_offset when a capacity estimate value C_est=C_est (Step S35).

Next, the BMU 36 sets the correction value (correction amount) of the capacity estimate value C_est to Cm, and calculates the coefficient of determination $R^2$ (=RR12) when C_est=C_est+Cm (Step S36).

Furthermore, the BMU 36 calculates the coefficient of determination $R^2$ (=RR13) when C_est=C_est−Cm (Step S37).

A value of the capacity estimate value C_est corresponding to the maximum coefficient of determination out of the coefficients of determination RR11 to RR13 that are calculated is set as a new capacity estimate value C_est (Step S38).

Next, the calculation of the capacity estimate value is more specifically explained.

FIG. 9 is an explanatory diagram of stabilization data stored.

A stabilization data 90 includes a valid flag (indicated as Valid F in FIG. 9), the SOC estimate value SOC, the current integrated value ΣI, and an elapsed time Σt.

FIG. 10 is an explanatory diagram for explaining the correction of the current integrated value ΣI of the stabilization data.

In FIG. 10, data in the following case are illustrated in columns in the order from a left side to a right side, that is, when current offset error estimate value I_offset=0.00 (in the case of no correction), when current offset error estimation value I_offset=−0.02, when current offset error estimation value I_offset=−0.03, when current offset error estimation value I_offset=−0.04, when current offset error estimation value I_offset=−0.05, when current offset error estimation value I_offset=−0.06, and when current offset error estimation value I_offset=−0.046.

Next, the explanation is specifically made with respect to the stabilization data table 101 in which the stabilization data 90 and the capacity estimate value C_est are stored.

FIG. 11 is an explanatory diagram of the stabilization data table.

In the example illustrated in FIG. 11, the stabilization data table 101 has one hundred storage areas corresponding to respective IDs 0 to 99. When a new stabilization data is generated, a validly/invalidity flag is set to valid (="1"), corresponding SOC estimate value SOC is stored, and the current integrated value ΣI and the elapsed time Σt from the time of storing the SOC estimate value SOC (the time of obtaining the SOC estimate value SOC) to the current time are stored. Furthermore, when there exists previously stored stabilization data where the validity/invalidity flag is set to "1", the current integrated value ΣI to which offset correction is applied with the above-mentioned procedures, the capacity estimate value C_est calculated by using the current integrated value ΣI to which the offset correction is applied, and the corresponding coefficient of determination $R^2$ are stored.

For example, in the case illustrated in FIG. 4, new stabilization data are generated at the time T1, the time T2, and the time T3. When the current time is the time T3, as for the stabilization data stored at the time T1, $ΣI_{(T1-T3)}$ is stored as a current integrated value, a time elapsed from the time T1 to the time T3 is stored as an elapsed time, the current integrated value ΣI to which offset correction is applied, the capacity estimate value C_est calculates by using the current integrated value ΣI to which the offset correction is applied, and the corresponding coefficient of determination $R^2$ are stored.

In the same manner as above, as for the stabilization data stored at the time T2, $ΣI_{(T2-T3)}$ is stored as a current integrated value, a time elapsed from the time T2 to the time T3 is stored as an elapsed time, the current integrated value ΣI to which offset correction is applied, the capacity estimate value C_est calculates by using the current integrated value ΣI to which the offset correction is applied, and the corresponding coefficient of determination $R^2$ are stored.

Furthermore, as for the stabilization data stored at the time T3, $ΣI_{(T3-T3)}$ (=0) is stored as a current integrated value, and a time elapsed from the time T3 to the time T3 (=0) is stored as an elapsed time.

To be more specific, it is assumed that the current time is the time T3 illustrated in FIG. 4 and the stabilization data stored at the time T1 is the stabilization data corresponding to that ID=2. In this assumption, the SOC estimate value SOC is set to 53.1. Furthermore, the $ΣI_{(T1-T3)}$ that is set to 13,420 (A·s) is stored (updated) as a current integrated value, and a time elapsed from the time T1 to the time T3 is set to 4,055 (s) and is stored (updated) as an elapsed time. Moreover, the current integrated value ΣI to which offset correction is applied is stored (updated) to be 12,135, the capacity estimate value C_est calculated by using the current integrated value ΣI to which the offset correction is applied is stored (updated) to be 17.92, and the corresponding coefficient of determination R2 is stored (updated) to be 0.85.

Concurrently with above, it is assumed that the stabilization data stored at the time T2 illustrated in FIG. 4 is the stabilization data corresponding to ID-3. In this assumption, the SOC estimate value SOC is set to 56.4, the $ΣI_{(T2-T3)}$ that is set to 9,345 (A·s) is stored (updated) as a current integrated value, and the time elapsed from the time T2 to the time T3 is set to 2,856 (s) and is stored (updated) as an elapsed time. Furthermore, the current integrated value ΣI to which offset correction is applied is stored (updated) to be 7991, the capacity estimate value C_est calculated by using the current integrated value ΣI to which the offset correction is applied is stored (updated) to be 18.03, and the corresponding coefficient of determination $R^2$ is stored (updated) to be 0.98.

Furthermore, as for the stabilization data newly stored at the time T3, in the storage area of the stabilization data such that ID=4, the SOC estimate value SOC that is set to 47.3 is newly stored, the $ΣI_{(T3-T3)}$ that is set to 0 (A·s) is stored as a current integrated value, a time elapsed from the time T3 to the time T3 is set to 0 (s), and the time that is set to 0 (s) is stored as an elapsed time.

Figure 12A:
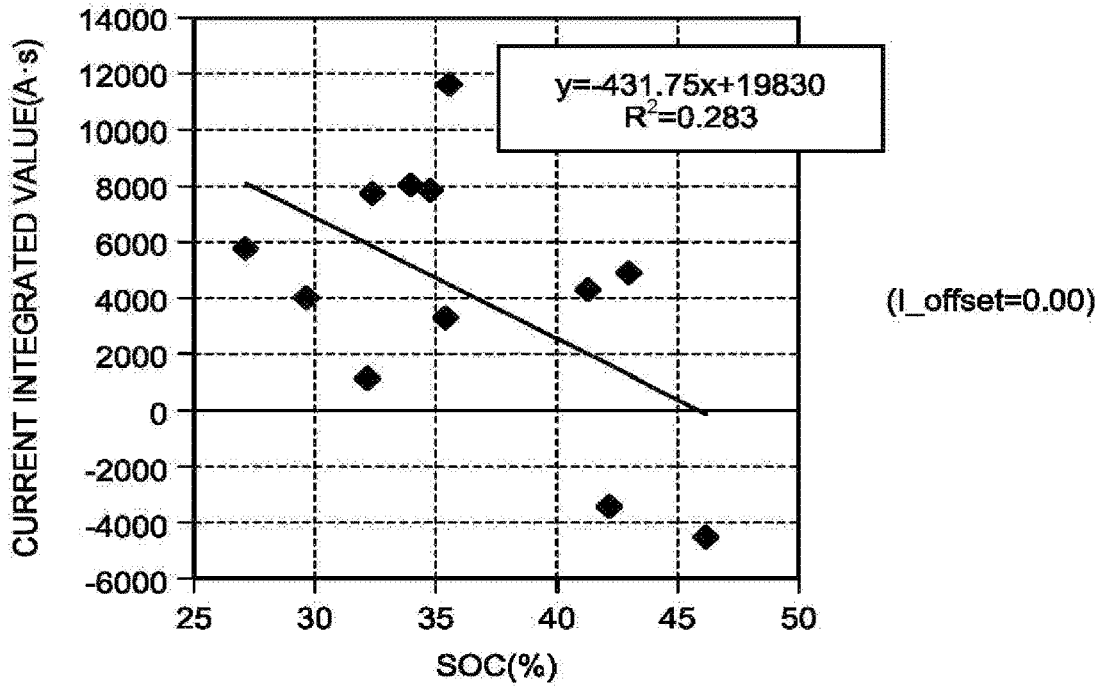
FIG. 12A is a diagram where stabilization data is plotted with an axis of abscissa corresponding to the SOC estimate value and an axis of ordinate corresponding to the current integrated value on the assumption that the current offset error estimate value I_offset is set to 0.00 (in the case of no correction).

FIG. 12A is a diagram where stabilization data is plotted with an axis of abscissa corresponding to the SOC estimate value and an axis of ordinate corresponding to the current integrated value on the assumption that the current offset error estimate value I_offset is set to 0.00 (in the case of no correction).

Figure 12B:
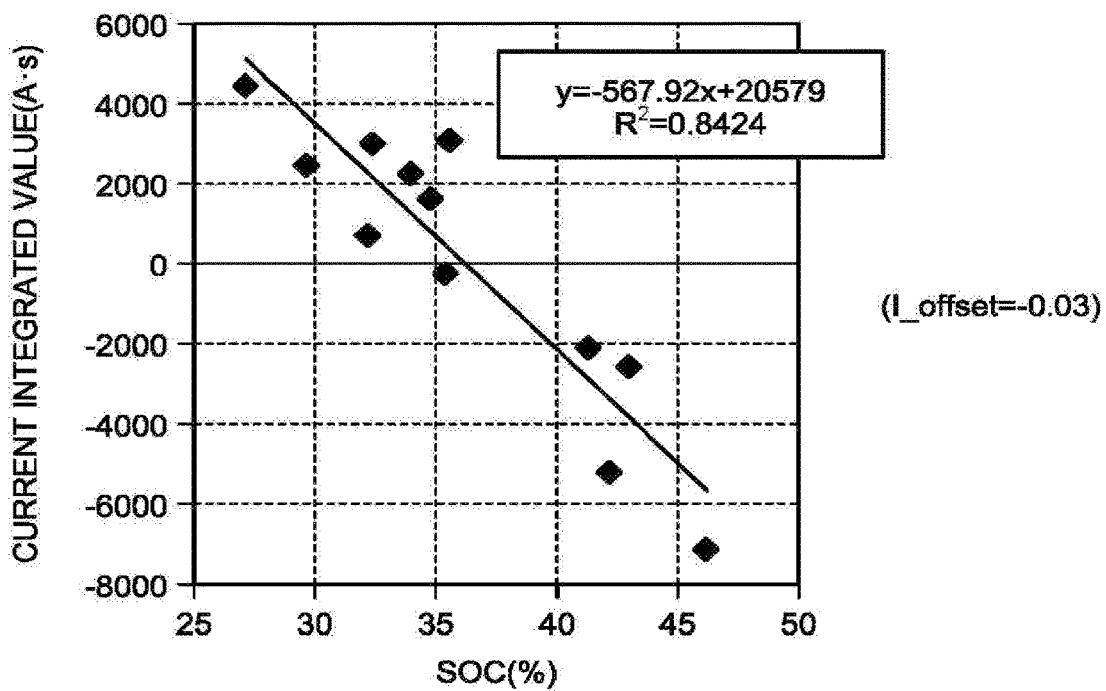
FIG. 12B is a diagram where stabilization data is plotted with an axis of abscissa corresponding to the SOC estimate value and an axis of ordinate corresponding to the current integrated value on the assumption that the current offset error estimate value I_offset is set to −0.03.

FIG. 12B is a diagram where stabilization data is plotted with an axis of abscissa corresponding to the SOC estimate value and an axis of ordinate corresponding to the current integrated value on the assumption that the current offset error estimate value I_offset is set to −0.03.

Figure 12C:
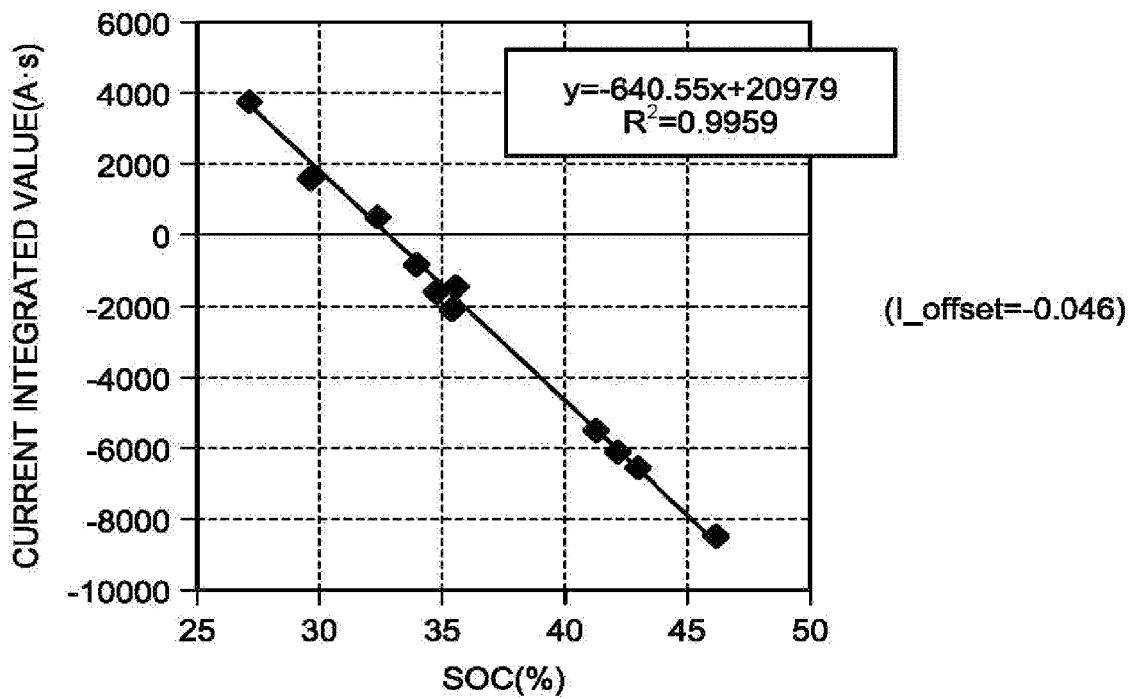
FIG. 12C is a diagram where stabilization data is plotted with an axis of abscissa corresponding to the SOC estimate value and an axis of ordinate corresponding to the current integrated value on the assumption that the current offset error estimate value I_offset is set to −0.046.

FIG. 12C is a diagram where stabilization data is plotted with an axis of abscissa corresponding to the SOC estimate value and an axis of ordinate corresponding to the current integrated value on the assumption that the current offset error estimate value I_offset is set to −0.046.

As illustrated in FIG. 12A, when the current offset error estimate value I_offset is set to 0.00, that is, in the case of no correction, the coefficient of determination $R^2$ is 0.283, and no correlation between the stabilization data is observed.

On the other hand, as illustrated in FIG. 12B, when the current offset error estimate value I_offset is set to −0.03, the coefficient of determination $R^2$ is 0.8424, and the correlation between the stabilization data is considered to be higher as compared with the case of no correction.

Furthermore, as illustrated in FIG. 12C, when the current offset error estimate value I_offset is set to −0.046, the coefficient of determination $R^2$ is 0.9959, and high correlation between the stabilization data is surely observed.

Consequently, it is capable of estimating more accurately the capacity of storage battery system 3 by using the stabilization data in a state where high correlation between the stabilization data is surely observed, that is, using the inclination of the SOC-current integrated value curve to estimate the capacity.

As explained above, according to the first embodiment, it is possible to obtain a highly stable (that is, less fluctuant) and reliable capacity estimate value by using more information without stopping the charge-and-discharge operation as the application for fluctuation suppression in an operation state.

2. Second Embodiment

Although in the first embodiment, the occurrence of the stabilization state or the non-stabilized state is detected to perform an estimation processing, the storage battery system is operated in a state that the SOC is set to a predetermined value (an average SOC is set to 50%, for example) depending on the system to be operated, and there exists the case that an SOC estimation processing is incapable of being accurately performed because the stabilization state or the non-stabilized state does not necessarily appear clearly in a normal operation state.

Accordingly, in the second embodiment, the transition between the stabilization state and the non-stabilized state is intentionally made thus performing accurately the SOC estimation processing.

The following explanation is made with respect to the case where in a system that is operated throughout the year and controlled so that the average SOC is set to 50% in a standby state, the SOC estimation processing is continuously performed over a period of ten days.

In this case, in order not to stop the operation of the system, the system is operated so that the average SOC is set to 50% on the first day and the tenth day in an SOC estimation processing period, operated so that the average SOC is set to 65% on the second day, the fourth day, the sixth day, and the eighth day in the SOC estimation processing period, and operated so that the average SOC is set to 35% on the third day, the fifth day, the seventh day, and the ninth day in the SOC estimation processing period.

Figure 13:
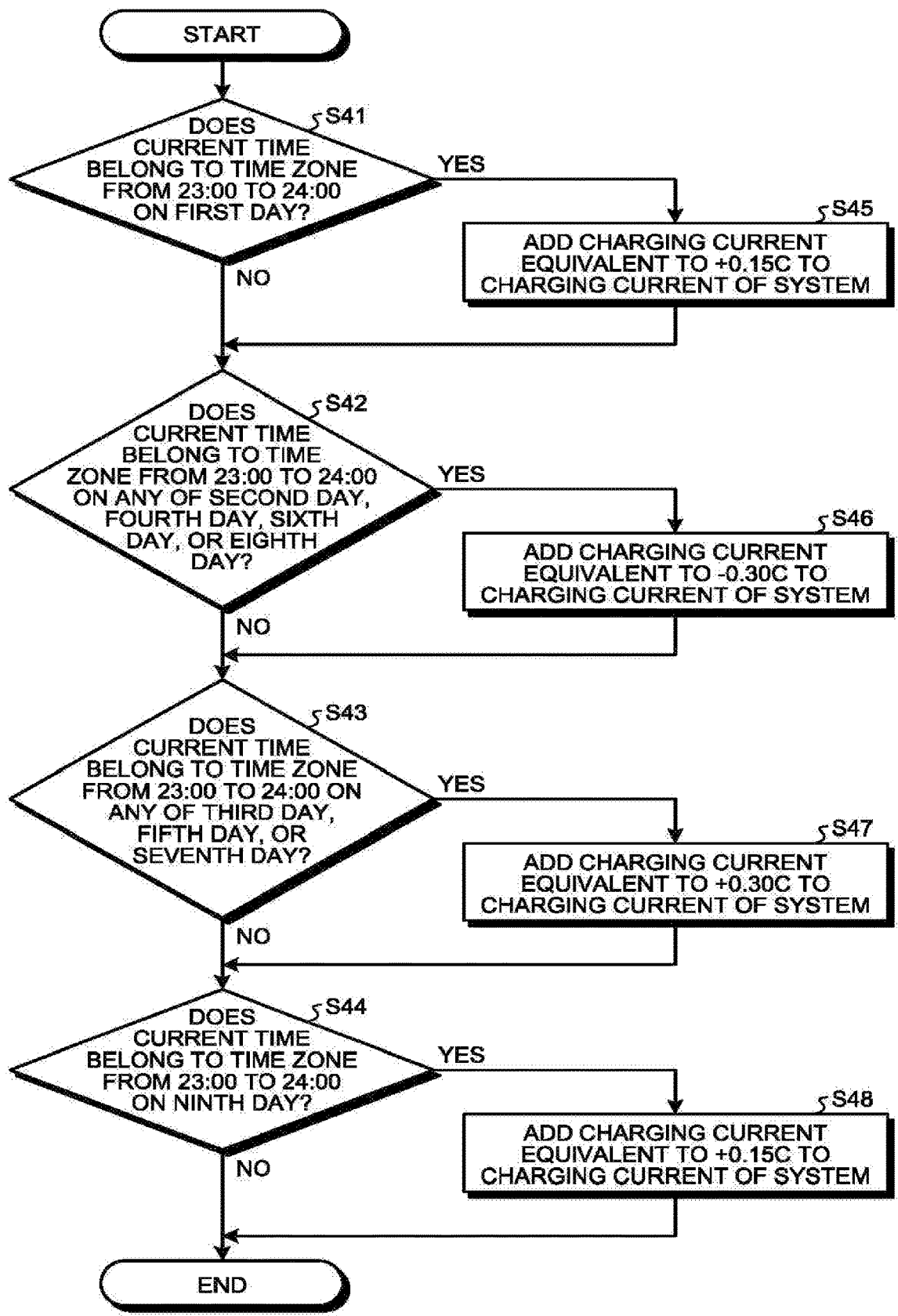
FIG. 13 is a processing flowchart when an average SOC is controlled.

FIG. 13 is a processing flowchart when the average SOC is controlled.

First of all, the BMU 36 determines whether the current time belongs to the time zone from 23:00 to 24:00 on the first day in the SOC estimation processing period (Step S41).

In determining at Step S41, when the current time does not belong to the time zone from 23:00 to 24:00 on the first day in the SOC estimation processing period (No at Step S41), the BMU 36 advances the processing to Step S42.

In determining at Step S41, when the current time belongs to the time zone from 23:00 to 24:00 on the first day in the SOC estimation processing period (Yes at Step S41), the BMU 36 causes the battery to be charged with a charging current obtained by adding a charging current equivalent to +0.15 C to the charging current of the system (Step S45). As a result, at the time when the date changes to the second day (at the point of time of 24:00 on the first day), the average SOC is set to 65%.

Subsequently, the BMU 36 determines whether the current time belongs to the time zone from 23:00 to 24:00 on any of the second day, the fourth day, the sixth day, or the eighth day in the SOC estimation processing period (Step S42).

In determining at Step S42, when the current time does not belong to the time zone from 23:00 to 24:00 on the second day, the fourth day, the sixth day, or the eighth day in the SOC estimation processing period (No at Step S42), the BMU 36 advances the processing to Step S43.

In determining at Step S42, when the current time belongs to the time zone from 23:00 to 24:00 on the second day, the fourth day, the sixth day, or the eighth day in the SOC estimation processing period (Yes at Step S42), the EMU 36 causes the battery to be charged with a charging current obtained by adding a charging current equivalent to −0.30 C to the charging current of the system (Step S46). As a result, at the time when the date changes to the third day, the fifth day, the seventh day, on the ninth day (at the point of time of 24:00 on the second day, the fourth day, the sixth day, or the eighth day), the average SOC is set to 35%.

Subsequently, the BMU 36 determines whether the current time belongs to the time zone from 23:00 to 24:00 on any of the third day, the fifth day, or the seventh day in the SOC estimation processing period (Step S43).

In determining at Step S43, when the current time does not belong to the time zone from 23:00 to 24:00 on the third day, the fifth day, or the seventh day in the SOC estimation processing period (No at Step S43), the BMU 36 advances the processing to Step S44.

In determining at Step S43, when the current time belongs to the time zone from 23:00 to 24:00 on the third day, the fifth day, or the seventh day in the SOC estimation processing period (Yes at Step S43), the EMU 36 causes the battery to be charged with a charging current obtained by adding a charging current equivalent to +0.30 C to the charging current of the system (Step S47). As a result, at the time when the date changes to the fourth day, the sixth day, or the eighth day (at the point of time of 24:00 on the third day, the fifth day, or the seventh day), the average SOC is again set to 65%.

Subsequently, the BMU 36 determines whether the current time belongs to the time zone from 23:00 to 24:00 on the ninth day in the SOC estimation processing period (Step S44).

In determining at Step S44, when the current time does not belong to the time zone from 23:00 to 24:00 on the ninth day in the SOC estimation processing period (No at Step S44), the BMU 36 terminates the processing for controlling the average SOC.

In determining at Step S44, when the current time belongs to the time zone from 23:00 to 24:00 on the ninth day in the SOC estimation processing period (Yes at Step S44), the BMU 36 causes the battery to be charged with the charging current obtained by adding a charging current equivalent to +0.15 C to the charging current of the system (Step S48). As a result, at the time when the date changes to the tenth day (at the point of time of 24:00 on the ninth day), the average SOC is again set to 50% and hence, the BMU 36 terminates the processing for controlling the average SOC.

Figure 14:
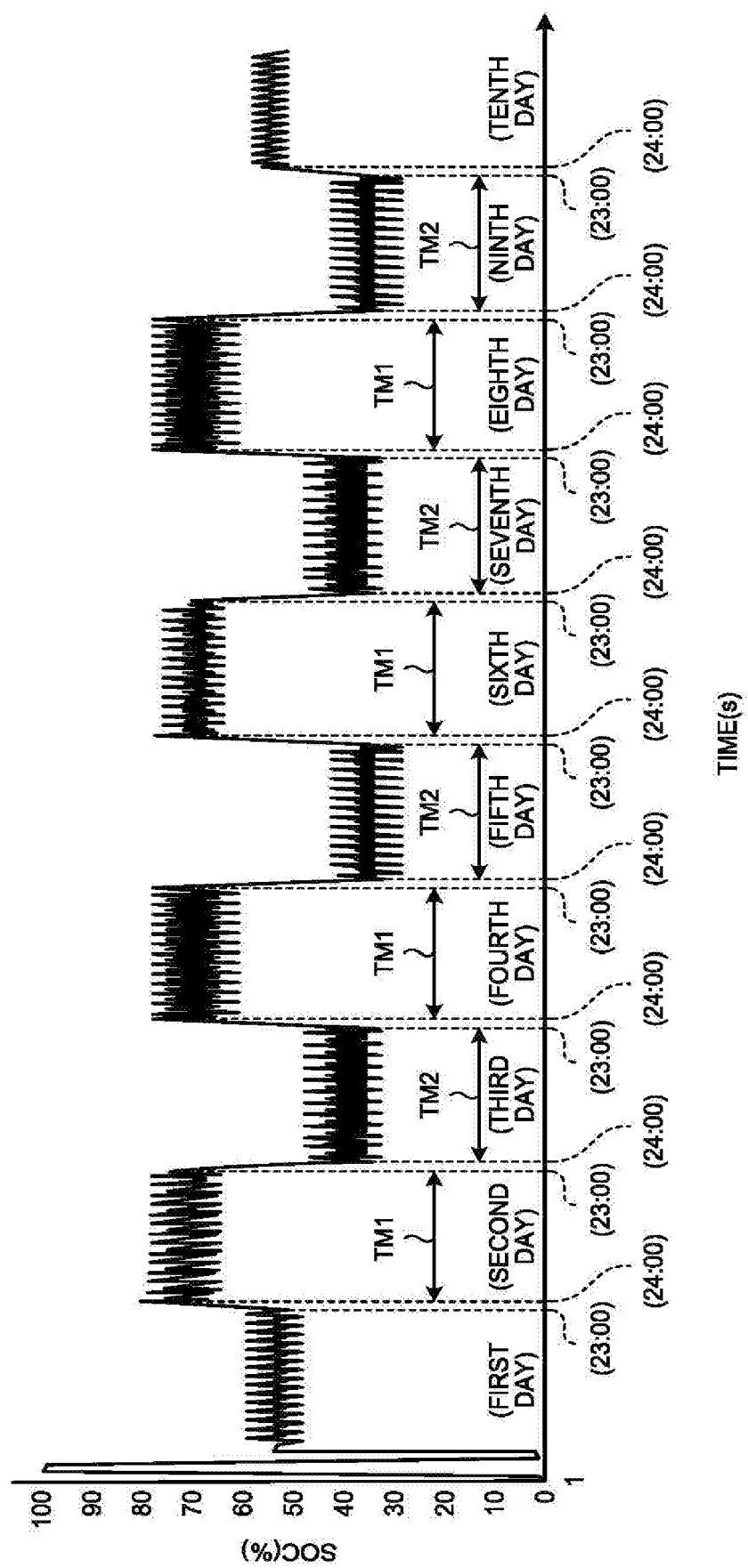
FIG. 14 is an explanatory diagram of one example of system log data when average SOC-control processing is performed.

FIG. 14 is an explanatory diagram of one example of system log data when average SOC-control processing is performed.

As illustrated in FIG. 14, assuming that the average SOC is changed day by day, and the stabilization state is established on a day-to-day basis, the regression analysis is performed in the procedure similar to the case of the first embodiment.

In this case, the usages of the respective data in an interval TM1 of the average SOC that is set to 65% and an interval TM2 of the average SOC that is set to 35% are examined.

Figure 15:
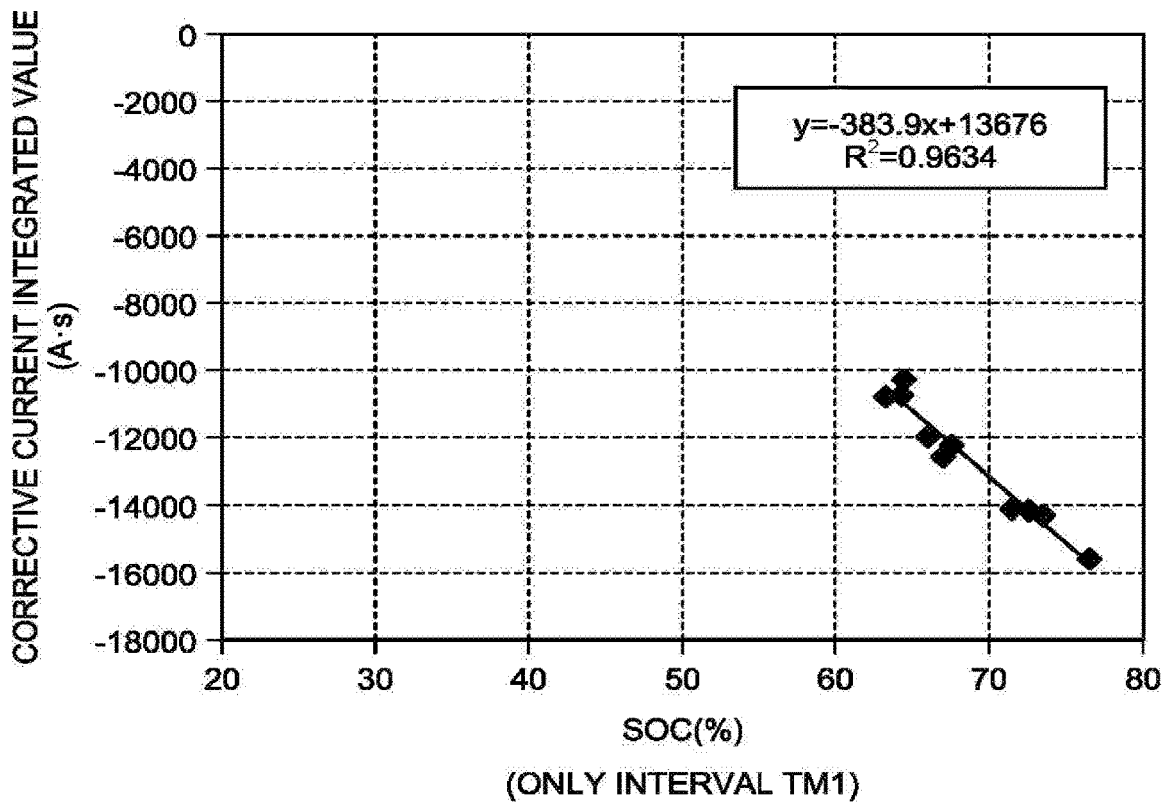
FIG. 15 is an explanatory diagram of a regression analysis result when the regression analysis is performed by using data obtained from an interval TM1 only.

FIG. 15 is an explanatory diagram of a regression analysis result when the regression analysis is performed by using data obtained from the interval TM1 only.

Figure 16:
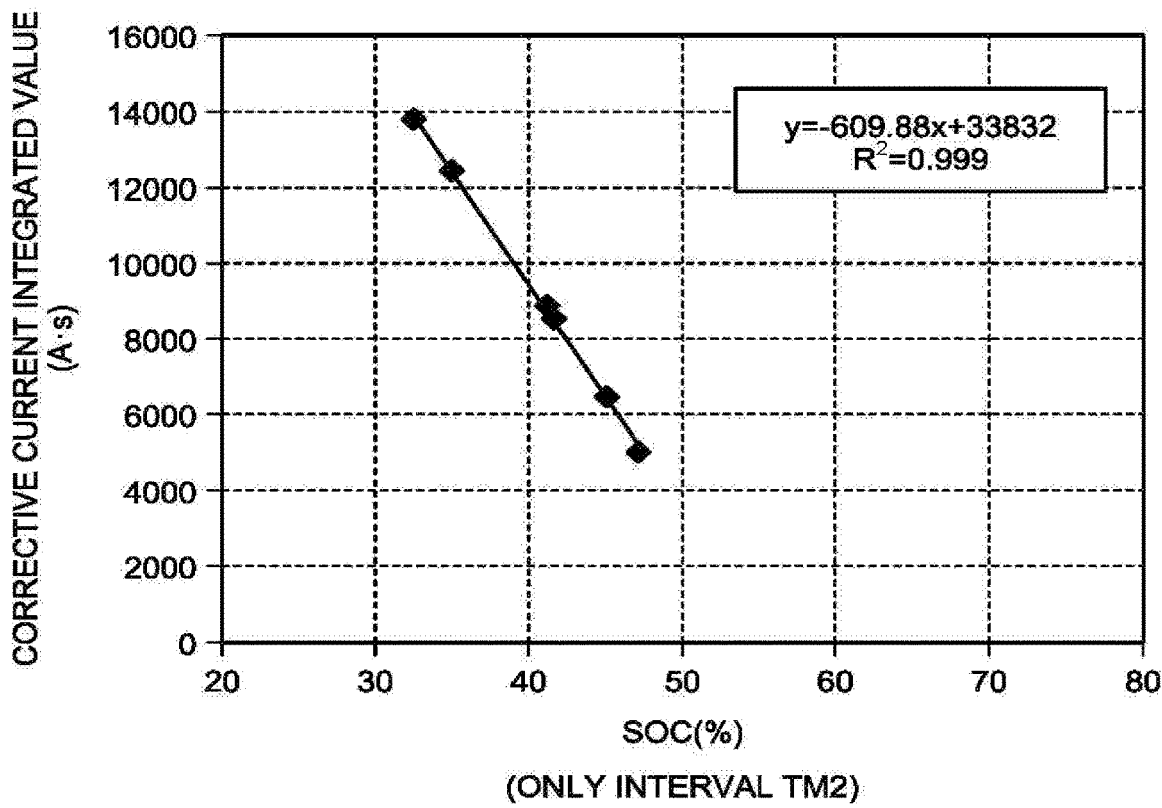
FIG. 16 is an explanatory diagram of a regression analysis result when the regression analysis is performed by using data obtained from an interval TM2 only.

FIG. 16 is an explanatory diagram of a regression analysis result when the regression analysis is performed by using data obtained from the interval TM2 only.

Figure 17:
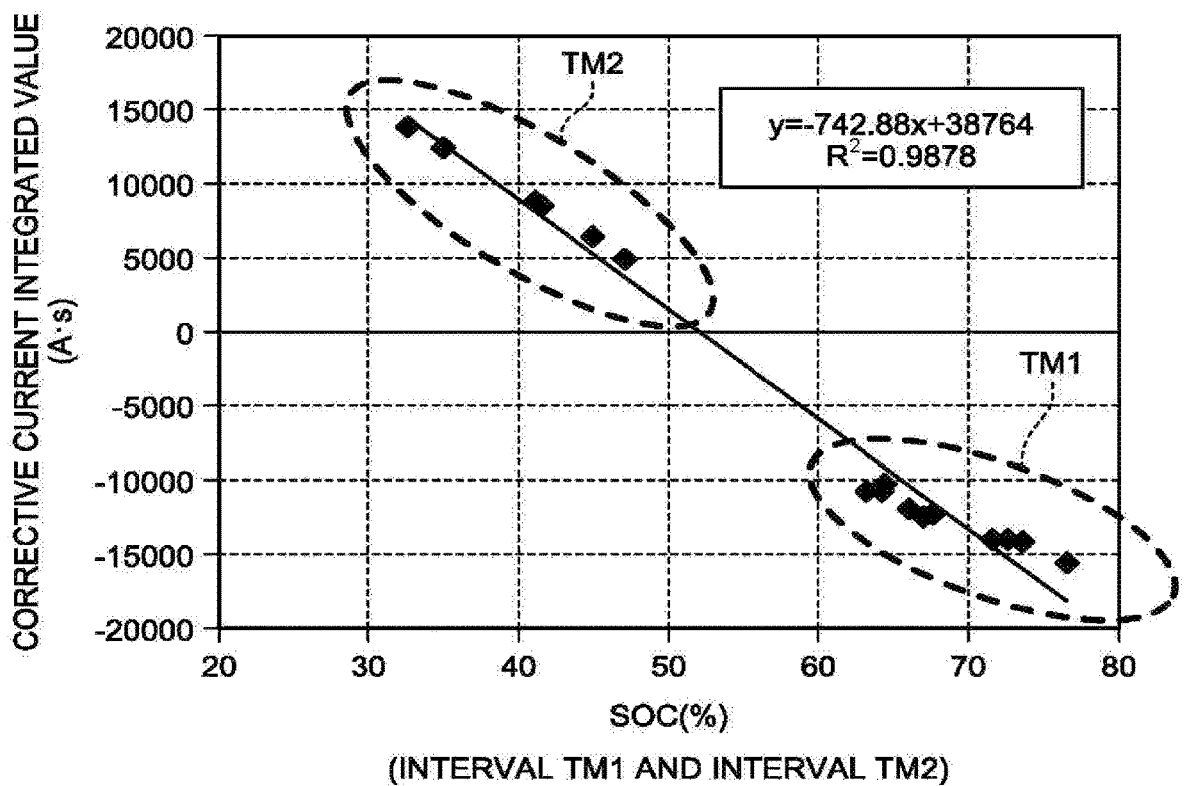
FIG. 17 is an explanatory diagram of a regression analysis result when the regression analysis is performed by using data obtained from both the interval TM1 and the interval TM2.

FIG. 17 is an explanatory diagram of a regression analysis result when the regression analysis is performed by using data obtained from both the interval TM1 and the interval TM2.

Figure 18:
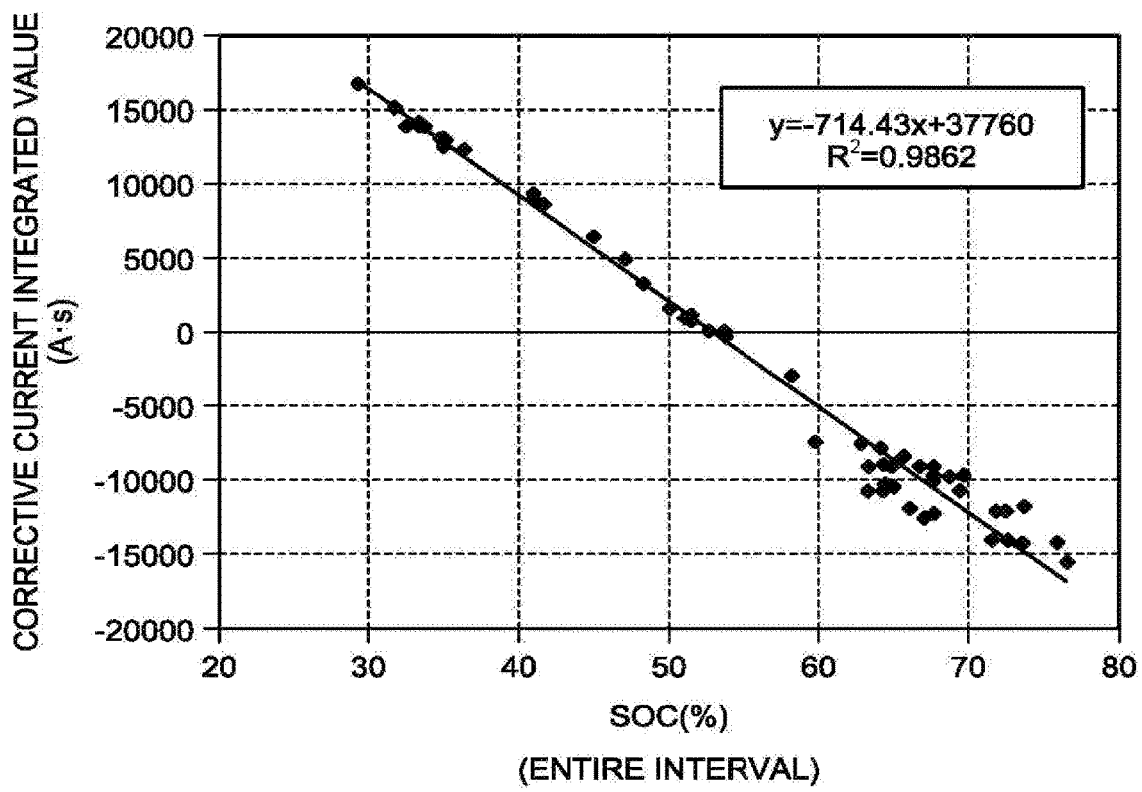
FIG. 18 is an explanatory diagram of a regression analysis result when the regression analysis is performed by using data obtained from an entire interval.

FIG. 18 is an explanatory diagram of a regression analysis result when the regression analysis is performed by using data obtained from the entire interval.

In this case, assuming that the measured capacity of the storage battery systems 3 is 20.49 Ah, the capacity estimate value was calculated based on each of the regression analysis results.

As illustrated in FIG. 15, the capacity estimate value was first calculated based on the regression analysis result when the regression analysis had been performed with only the data obtained from the interval TM1, then $$(383.9/3,600) \times 100 = 10.7 \text{(Ah)},$$

and the error with respect to the measured capacity of the storage battery systems 3 became −47.8%.

In the same manner as above, as illustrated in FIG. 16, the capacity estimate value was calculated based on the regression analysis result when the regression analysis had been performed with only the data obtained from the interval TM2, then $$(609.88/3,600) \times 100 = 16.94 \text{(Ah)},$$

and the error with respect to the measured capacity of the storage battery systems 3 became −17.3%.

Furthermore, as illustrated in FIG. 17, the capacity estimate value was calculated based on the regression analysis result when the regression analysis had been performed with only the data obtained from the interval TM1 and the interval TM2, then $$(742.88/3,600) \times 100 = 20.63 \text{(Ah)},$$

and the error with respect to the measured capacity of the storage battery systems 3 became +0.7%.

In addition, as illustrated in FIG. 18, the capacity estimate value was calculated based on the regression analysis result when the regression analysis had been performed with the data obtained from the entire interval, then $$(714.43/3,600) \times 100 = 19.85 \text{(Ah)},$$

and the error with respect to the measured capacity of the storage battery systems 3 became −3.1%.

As explained above, according to the second embodiment, the storage battery system is operated with the advantageous effect of the first embodiment in a state that the average SOC is set to a predetermined value (the average SOC=50%, for example), and even when the SOC estimation processing is incapable of being accurately performed because the stabilization state or the non-stabilized state does not necessarily appear clearly in a normal operation state, average-SOC transition between the stabilization state and the non-stabilized state is intentionally made in the SOC estimation processing thus estimating accurately the system capacity.

3. Advantageous Effects of Embodiments

According to each of the embodiments, as long as data that satisfies predetermined conditions can be obtained as a result of charge-and-discharge processing performed by an application (control program) that controls an intended secondary battery system (equivalent to the storage battery systems 3 in the present embodiment), it is possible to estimate the capacity of the secondary battery system irrespective of a full charge state or a completely discharged state while maintaining an operation state without stopping the charge-and-discharge operation of the application.

Accordingly, it is unnecessary to stop the secondary battery system for estimating the capacity of the secondary battery system and hence, it is possible to improve effectively the availability factor of the secondary battery system.

Furthermore, it is also possible to simultaneously obtain the estimate value of the average value of the offset error of the current sensor, thus compensating the offset error to measure accurately an amount of electric current.

4. Modifications of Embodiment 4.1. First Modification

It is possible to use Kaufman-filter SOC estimation processing as specific realization means of the SOC estimation processing based on cell voltage data. The Kaufman-filter SOC estimation processing creates a model capable of simulating the voltage behavior of the cell to correct and converge the SOC value that is an internal parameter so that the voltage output of the model and the measured cell voltage coincide with each other thus performing the SOC estimation processing.

4.2. Second Modification

In a secondary battery cell, in general, there exists a self-discharge phenomenon where the SOC (residual quantity) spontaneously decreases without the charge-and-discharge operation intentionally performed from the outside. The self-discharge phenomenon is considered equivalent to a phenomenon where the cell actually discharges with minute electric current to the outside.

However, the self-discharge phenomenon is not measured by the current sensor that is actually installed, thus constituting apparently a part of the offset error of the current sensor. Accordingly, the accurate offset error of the current sensor may be obtained by subtracting the effect of the self discharge (equivalent current value) that is obtained in advance, from the estimate value of the offset error that is obtained by the method according to the embodiment.

4.3. Third Modification

Since the variation in voltage or SOC occurs in the secondary battery cells or the secondary battery modules (or cell packs) that are connected in series, a structure that performs a balance operation for equalizing the variation, such as a balancers (a balance circuit), is generally installed.

In the balance operation, the following operation is generally performed; that is, both ends (positive terminal and negative terminal) of a cell (or module) high in voltage or SOC are short-circuited via a resistance or the like to discharge the cell, and the voltage or the SOC of the cell (or module) high in voltage or SOC is brought close to that of a cell (or module) low in voltage or SOC. That is, when the balance operation is performed, some of the cells (or modules) are discharged, and the discharge current value of each cell discharged is not measured by the current sensor thus constituting the cause of error in the method according to the embodiment.

Accordingly, in order to ensure capacity estimation accuracy, it is preferable to perform capacity estimation by the method according to embodiment only when required, and stop the balance operation in a period of performing the capacity estimation.

4.4. Fourth Modification

The electric storage capacity estimation apparatus according to the present embodiment is capable of being provided with a hardware configuration using a general computer including a controller such as a CPU, storage devices such as a read only memory (ROM) or a RAM, an external storage device such as an HDD or a CD drive, a monitoring device such as a display device, an input device such as a keyboard or a mouse, or the like.

Accordingly, a program executed in the electric storage capacity estimation apparatus according to the present embodiments is provided in the form of the storage medium capable of being read by the computer; that is, a CD-ROM, a flexible disk (FD), a CD-R, a digital versatile disc (DVD), or the like in which the program is stored in an uninstallable or executable file.

The program executed in the electric storage capacity estimation apparatus according to the present embodiment may be stored in a computer connected to a network such as the Internet and provided by being downloaded via the network. Furthermore, the program executed in the electric storage capacity estimation apparatus according to the present embodiment may be provided or distributed via a network such as the Internet.

In addition, the program executed in the electric storage capacity estimation apparatus according to the present embodiments may be provided in the form of the ROM or the like into which the program is integrated in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A battery capacity estimation apparatus comprising:
one or more hardware processors that:
calculate a current integrated value by integrating electric currents of a secondary battery system whose capacity is to be estimated, the electric currents being detected by a current sensor;
calculate an SOC estimate value in a stabilization state where a change in SOC of a secondary battery per unit time is comparatively small, the secondary battery constituting the secondary battery system;
perform a regression analysis in which the current integrated value is defined as a dependent variable and the SOC estimate value is defined as an independent variable, the regression analysis being performed while correcting the current integrated value based on a value of a coefficient of determination so that a result of the regression analysis has predetermined accuracy; and
estimate a capacity of the secondary battery system based on the result of the regression analysis.

2. The battery capacity estimation apparatus according to claim 1, wherein the one or more hardware processors calculate the SOC estimate value at a time of switching to the stabilization state from a non-stabilized state.

3. The battery capacity estimation apparatus according to claim 1, wherein the one or more hardware processors perform the correction of the current integrated value in consideration of a current offset error corresponding to an integration period of the current integrated value.

4. The battery capacity estimation apparatus according to claim 1, wherein the one or more hardware processors use a Kalman filter to calculate the SOC estimate value.

5. A method that is performed in a battery capacity estimation apparatus configured to estimate a battery capacity of a secondary battery system including a current sensor, the method comprising:
calculating a current integrated value by integrating electric currents of the secondary battery system whose capacity is to be estimated, the electric currents being detected by the current sensor;
calculating an SOC estimate value in a stabilization state where a change in SOC of a secondary battery per unit time is comparatively small, the secondary battery constituting the secondary battery system;
performing a regression analysis in which the current integrated value is defined as a dependent variable and the SOC estimate value is defined as an independent variable, the regression analysis being performed while correcting the current integrated value based on a value of a coefficient of determination so that a result of the regression analysis has predetermined accuracy; and
estimating a capacity of the secondary battery system based on the result of the regression analysis.

6. A computer program product for controlling a battery capacity estimation apparatus configured to estimate a battery capacity of a secondary battery system including a current sensor, the computer program comprising:
a non-transitory computer readable medium storing programmed instructions which are executed by a computer to carry out:
calculating a current integrated value by integrating electric currents of the secondary battery system whose capacity is to be estimated, the electric currents being detected by the current sensor;
calculating an SOC estimate value in a stabilization state where a change in SOC of a secondary battery per unit time is comparatively small, the secondary battery constituting the secondary battery system;
performing a regression analysis in which the current integrated value is defined as a dependent variable and the SOC estimate value is defined as an independent variable, the regression analysis being performed while correcting the current integrated value based on a value of a coefficient of determination so that a result of the regression analysis has predetermined accuracy; and
estimating a capacity of the secondary battery system based on the result of the regression analysis.

7. A storage battery system comprising:
a secondary battery system; and
a battery capacity estimation apparatus,
the battery capacity estimation apparatus comprising one or more hardware processors that:
calculate a current integrated value by integrating electric currents of the secondary battery system whose capacity is to be estimated, the electric currents being detected by a current sensor;
calculate an SOC estimate value in a stabilization state where a change in SOC of a secondary battery per unit time is comparatively small, the secondary battery constituting the secondary battery system;
perform a regression analysis in which the current integrated value is defined as a dependent variable and the SOC estimate value is defined as an independent variable, the regression analysis being performed while correcting the current integrated value based on a value of a coefficient of determination so that a result of the regression analysis has predetermined accuracy; and
estimate a capacity of the secondary battery system based on the result of the regression analysis.

8. The storage battery system according to claim 7, wherein the secondary battery system is brought into a predetermined stabilization state during operation, and the secondary battery system switches to a plurality of stabilization states differing from the predetermined stabilization state by controlling a charging current supplied to the secondary battery system in the process of estimating the capacity of the secondary battery system.

9. The storage battery system according to claim 8, wherein the plurality of stabilization states include both a stabilization state where the SOC is increased and a stabilization state where the SOC is decreased with respect to the predetermined stabilization state.

10. The storage battery system according to claim 7, wherein the secondary battery system includes secondary cells connected in series to each other, or secondary battery modules connected in series to each other, and a balance circuit configured to suppress variation of voltage or SOC between the secondary cells connected in series to each other, or between the secondary battery modules connected in series to each other, and wherein operation of the balance circuit is restricted during a period of estimating the capacity of the secondary battery system.

* * * * *